(12) United States Patent
van Arendonk

(10) Patent No.: US 9,417,344 B1
(45) Date of Patent: Aug. 16, 2016

(54) GLASS CAP WIREBOND PROTECTION FOR IMAGING TILES IN AN X OR GAMMA RAY INDIRECT IMAGING DETECTOR

(71) Applicant: Teledyne DALSA, Inc., Waterloo, Ontario (CA)

(72) Inventor: Anton Petrus Maria van Arendonk, Waterloo (CA)

(73) Assignee: Teledyne Dalsa, Inc., Waterloo, Ontario (CA)

( * ) Notice: Subject to any disclaimer, the term of this patent is extended or adjusted under 35 U.S.C. 154(b) by 0 days.

(21) Appl. No.: 14/630,968

(22) Filed: Feb. 25, 2015

(51) Int. Cl.
| G01T 1/10 | (2006.01) |
| G01T 7/00 | (2006.01) |
| G01T 1/20 | (2006.01) |
| G01T 1/24 | (2006.01) |
| H05K 3/32 | (2006.01) |

(52) U.S. Cl.
CPC ... *G01T 7/00* (2013.01); *G01T 1/20* (2013.01); *G01T 1/24* (2013.01); *H05K 3/32* (2013.01)

(58) Field of Classification Search
CPC .................. H01L 27/14634; H01L 27/14676; G01T 1/243; G01T 1/247; G01T 3/08
See application file for complete search history.

(56) References Cited

U.S. PATENT DOCUMENTS

| 6,624,523 B2 | 9/2003 | Chao et al. |
| 8,269,300 B2* | 9/2012 | Chien ............... H01L 27/14618 257/431 |
| 8,614,421 B2 | 12/2013 | van Arendonk et al. |
| 2004/0056205 A1* | 3/2004 | Caruba ................. G01T 1/2928 250/370.15 |
| 2007/0107932 A1* | 5/2007 | Jauniskis ................ H01L 23/04 174/260 |
| 2009/0108473 A1 | 4/2009 | Wang et al. |
| 2009/0230531 A1* | 9/2009 | Do .......................... H01L 21/56 257/685 |

OTHER PUBLICATIONS

Adamson, et al., "Dam and Fill Encapsulation for Microelectronic Packages," Nepcon West, Feb. 1999, Anaheim, CA.
Bosiers et al., "An overview of Teledyne DALSA Professional Imaging CCD and CMOS capabilities" Proceedings 2013 Scientific Detector Workshop, Firenze, Italy, Oct. 2013.
Laurie Roth, "Wire Encapsulation Improves Fine-Pitch Device Yield," Semiconductor International, vol. 27 No. 11, Oct. 2004.
Farrier et al, "Very Large Area CMOS Active-Pixel Sensor for Digital Radiograpjy," IEEE Transactions on Electron Devices, vol. 56, No. 11, Nov. 2009, pp. 2623-2631.

* cited by examiner

*Primary Examiner* — Kiho Kim
(74) *Attorney, Agent, or Firm* — Eric A. Gifford

(57) ABSTRACT

Wirebond protection is provided for imaging tiles in which the imaging sensor and PCB are mounted side-by-side on a tile carrier for use in X or Gamma Ray indirect imaging detectors without use of a "glob top" encapsulant. A glass cap comprising a bead of adhesive material and a lid is formed to provide an enclosed open-air cavity around the wire bonds. As such, any expansion of the bead material does not produce mechanical stress on the wire bonds.

17 Claims, 7 Drawing Sheets

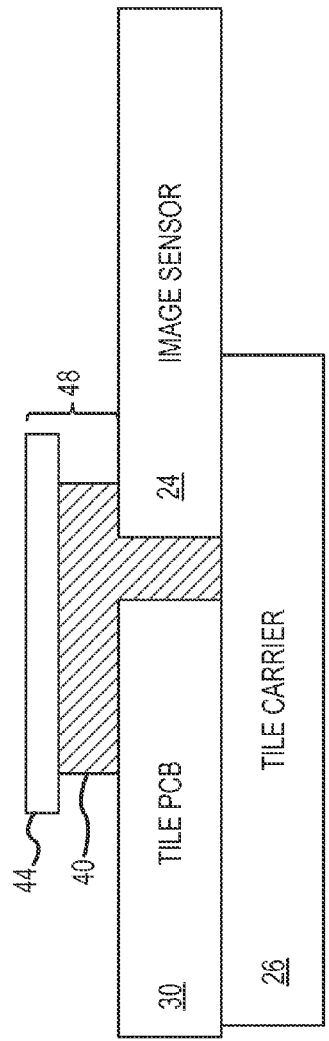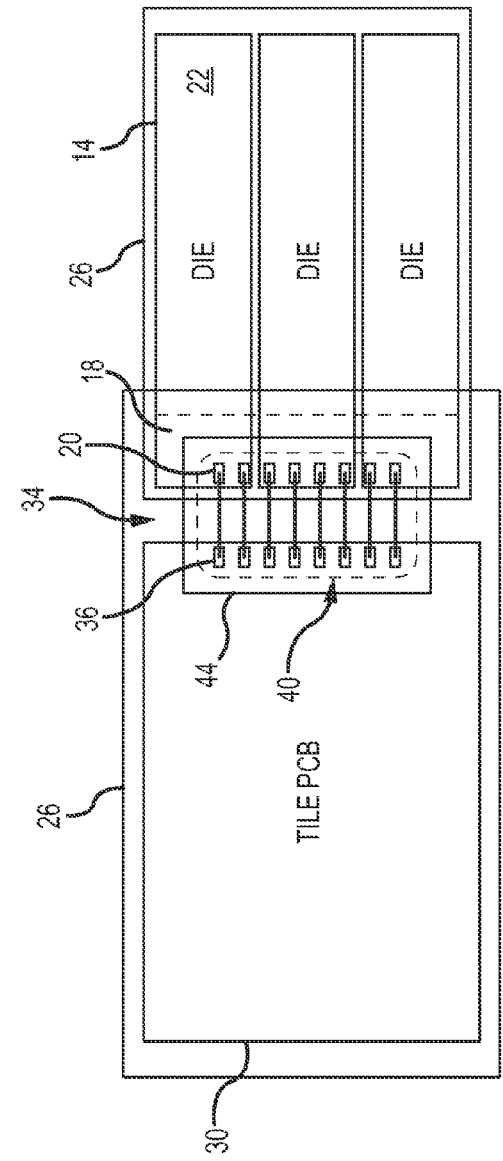

GLASS CAP WIREBOND PROTECTION FOR IMAGING TILES IN AN X OR GAMMA RAY INDIRECT IMAGING DETECTOR

BACKGROUND OF THE INVENTION

1. Field of the Invention

This invention relates to X or Gamma ray indirect imaging detectors and more specifically to wirebond protection without use of an encapsulant.

2. Description of the Related Art

X or Gamma ray indirect imaging detectors include a conversion layer or "scintillator" that converts X or Gamma rays to visible light, an optional fiber optic plate (FOP) that transfers light to an imaging plane and a visible band imaging sensor at the imaging plane. For X rays, phosphor or cesium-iodide are typical conversion layer materials. The FOP protects the imaging detector from being damaged by the high energy X or Gamma rays, prevents the sensor from reading those rays as light and takes the image created by the conversion layer and focuses it on the imaging sensor keeping the image sharp and coherent. Indirect imaging leverages the established visible band CCD and CMOS imaging technologies.

To read out the image, the imaging sensor is mounted onto a printed circuit board (PCB). Electrical contact pads in a non-imaging region on the surface of the imaging sensor are wirebonded to electrical contact pads on the PCB, which are attached to read out and other processing circuitry. The wire bonds are very fragile and susceptible to damage or failure due to corrosion or mechanical stress that may occur during final assembly and handling. The failure of even a single wire bond can result in the loss of the detector.

To protect the wire bonds, a "glob top" of material is used to encapsulate the wire bonds. A typical material is a low aspect ratio (AR) clear acrylate that will readily flow around the wire bonds to encapsulate them. The material is typically cured using UV light. This is industry standard approach to protect wire bonds in many different semiconductor packages.

More recently, X-ray detectors are being designed in "multi-tile" configurations in which each tile includes one or more imaging sensor dies to provide a larger and higher-resolution detector. The detector may be >30 mm per side. The die typically have a "surface flatness" that is far superior to that of the PCB. To address the surface flatness, on some architectures the imaging sensor and PCB are mounted side-by-side on a tile carrier having a surface flatness comparable to the die. The imaging sensor is wire bonded to the PCB and a glob top is used to encapsulate the wire bonds. See FIG. 5-2 of Jan Bosiers et. al., "An overview of Teledyne DALSA Professional Imaging CCD and CMOS capabilities" Proceedings 2013 Scientific Detector Workshop, Firenze, Italy, October 2013.

SUMMARY OF THE INVENTION

The present invention provides for wirebond protection for imaging tiles in X or Gamma Ray indirect imaging detectors without use of a "glob top" encapsulant in which the imaging sensor and PCB are mounted side-by-side on a tile carrier.

In an embodiment, each tile comprises an imaging sensor and a PCB mounted side-by-side on a tile carrier. The imaging sensor includes one or more CMOS or CCD dies configured to detect visible light. Each of the die are mounted on the common tile carrier and spaced apart from the PCB to define a trench there between. Wire bonds span the trench to connect electrical contacts on each die to electrical contacts on the PCB. A bead of adhesive material is applied to the top surface of the one or more die, in the trench to the surface of the tile carrier and on the top surface of the PCB that forms a continuous perimeter around and spaced apart from the plurality of wire bonds and from the imaging area of the die. The material is suitably a non-flowable material such as one having a thixotropic index of greater than 4 in its uncured state. A lid is placed on the bead of adhesive material, which is then cured, to form an enclosed open-air cavity around the wire bonds. In an embodiment, the adhesive material is UV cured and the tile carrier and lid are formed of UV-transparent materials. Alternately, the adhesive material may be a visible light, thermal or moisture curable adhesive. The lid may be formed from a material that is also visibly transparent to allow inspection of the wire bonds. A second bead of material may be formed around the perimeter of the lid and cured to make the enclosure air tight to protect the wire bond from environmental effects.

In an embodiment, one or more of the tiles are arranged with the backsides of the imaging sensors supported on a detector carrier. A conversion layer on the front side of the imaging sensor forms a detector core. The conversion layer is suitably formed on a carrier. In one embodiment, the conversion layer is formed on top of a fiber optic plate (FOP) that is attached to the front sides of the imaging sensors. In other embodiments, the conversion layer is formed on the bottom of a carbon or aluminum plate and attached to the imaging sensors.

In an embodiment, the detector core and a camera PCB are attached to opposing sides of a base plate, which is then mounted in a detector housing. Alternately, the detector core and camera PCB may be directly mounted within the detector housing. The camera PCB is electrically connected to the one or more tile PCBs and an external connector. The entire assembly is enclosed in a detector housing and a cover, configured to allow transmission of X or gamma rays is attached to the detector housing.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 2a, 2b and 2c are section, side and plan views of an embodiment of an imaging tile;

DETAILED DESCRIPTION OF THE INVENTION

Figure 1:
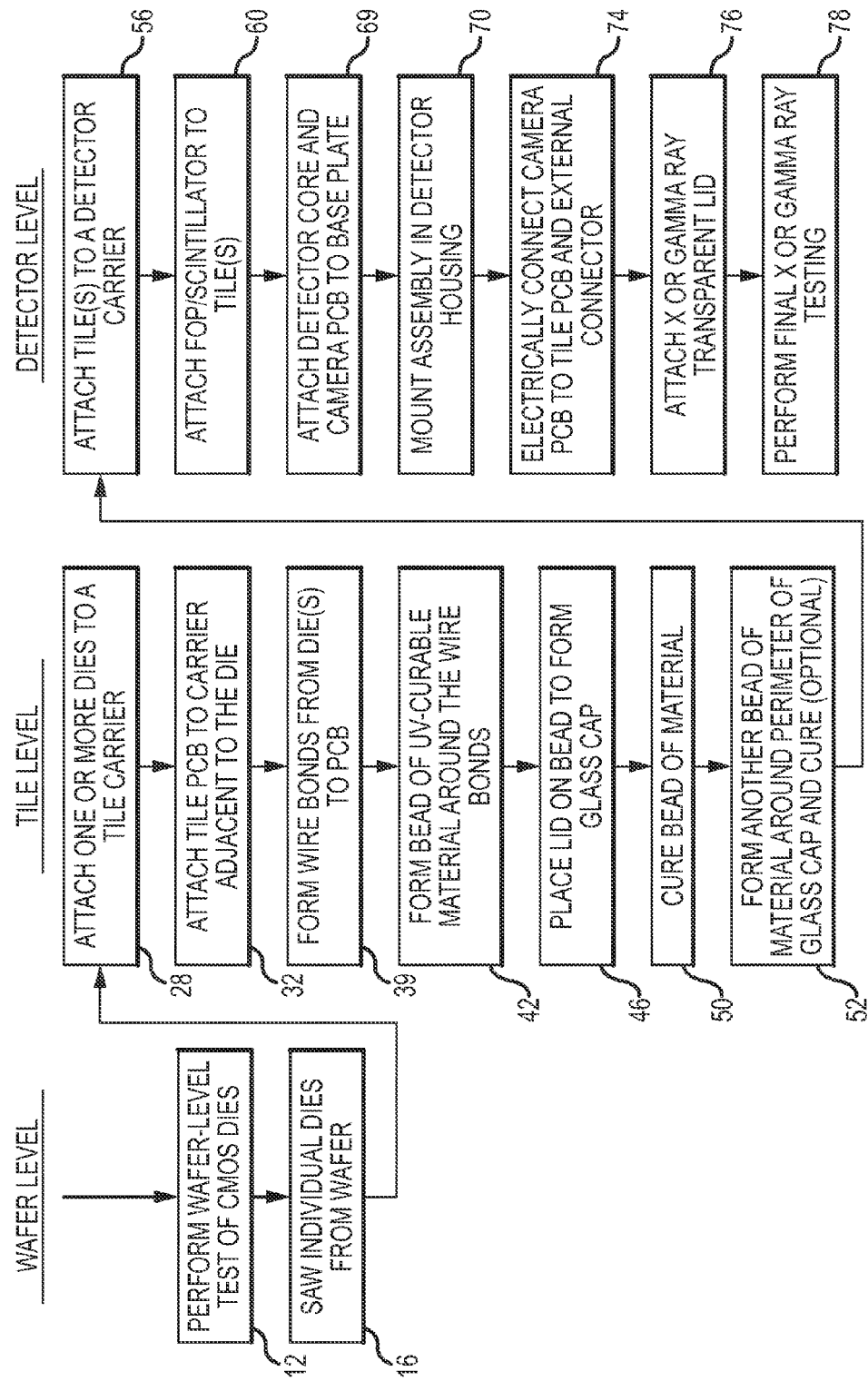
FIG. 1 is a flow diagram of an embodiment for assembling an X-ray detector with glass caps for wirebond protection.
Figure 2A:
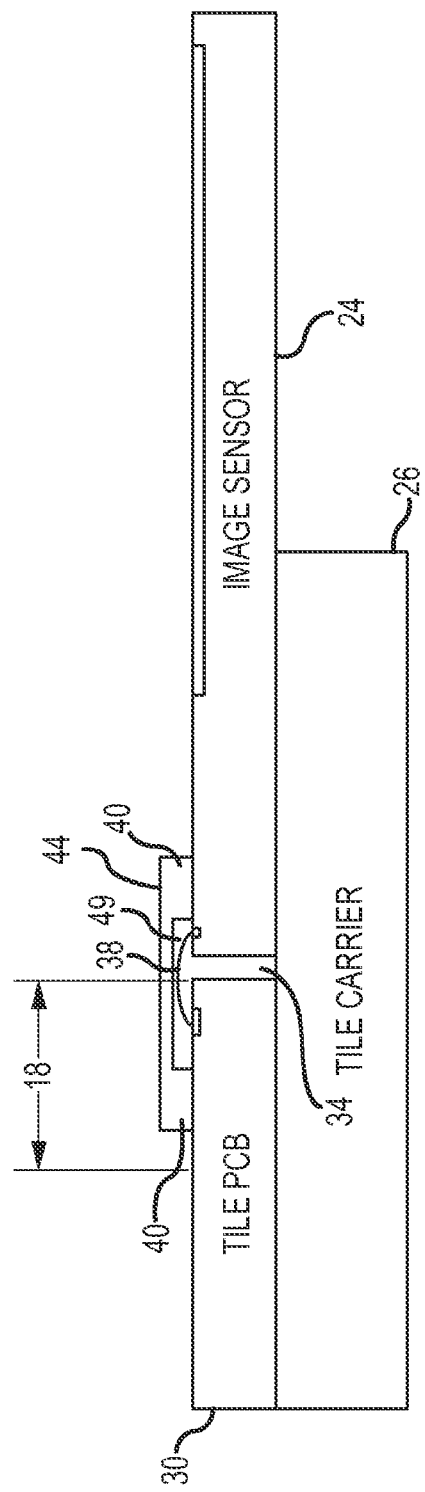

The present invention provides for wirebond protection for imaging tiles in X or Gamma Ray indirect imaging detectors without use of a "glob top" encapsulant in which the imaging sensor and PCB are mounted side-by-side on a tile carrier.

Testing of tiles in which the imaging sensor and PCB are mounted side-by-side on a tile carrier revealed that the process window to achieve reliable results with a conventional "glob top" encapsulant was small.

In this tile configuration, the encapsulant both surrounds the wire bonds and fills the trench formed between the imaging sensor and the PCB. This forms a long column of encapsulant material within the footprint of the wire bonds. The column formed by the trench effectively constrains the expansion of the encapsulant material due to changes in temperature. As a result, the expansion in the vertical direction may be doubled or even tripled. Because of the inherent differences in the thermal coefficients of expansion (TCE) of the encapsulant material and the wire bonds this expansion can generate mechanical stress on the wire bonds.

To protect the wire bonds from corrosion or mechanical stress that may occur during final assembly and handling, a glass cap comprising a bead of adhesive material and a lid is formed to provide an enclosed open-air cavity around the wire bonds. As such, any expansion of the adhesive material does not produce mechanical stress on the wire bonds. The adhesive material may be a UV, visible, thermal or moisture cured material.

Referring now to FIGS. 1, 2a-2c, 3 and 4a-4d, an embodiment of an X-ray imaging detector 10 and a method of assembly are depicted. This embodiment is directed to a multi-tile configuration of CMOS imaging die for X-ray detection. The architecture of the detector, method of assembly and in particular the configuration of the glass cap and method of assembly for protecting the wire bonds is applicable to single-tile configurations, CCD image die and for Gamma ray detection.

Assembly of the imaging detector 10 starts at the Wafer level with the performance of wafer-level testing of the individual CMOS dies (step 12). The individual dies 14 are sawed from the wafer (step 16). Each die has a non-imaging area 18 that includes electrical contact pads 20 and an imaging area 22 configured to detect visible light. In an embodiment, the individual die may be 100 mm×100 mm. The CMOS dies may be fabricated using Silicon or InGaAs technology.

Tile-level assembly of each tile 23 comprises attaching one or more of the individual die 14 that together form an image sensor 24 to a tile carrier 26 (step 28). A tile PCB 30 is attached to tile carrier 26 adjacent image sensor 24 (step 32) forming a trench 34 there between. Tile PCB 30 has a plurality of electrical contact pads 36 that are electrically connected to read out or other processing circuitry for processing the detected image. Wire bonds 38 are formed from the die contact pads 20 to the PCB contact pads 36 spanning trench 34 (step 39). The surfaces of the image sensor 24 and tile PCB 30 are preferably substantially co-planar. Often the tile PCB is thicker than the image sensor in which case the tile carrier 26 would be "stepped" such that the image sensor and tile PCB are coplanar. The tile carrier may formed of a Silicon or InGaAs material.

A bead 40 of UV-cured adhesive material is formed on the top surface of the one or more die 14, in the trench 34 to the surface of the tile carrier 26 and on the top surface of the tile PCB 30 that forms a continuous perimeter around and spaced apart from the plurality of wire bonds 38 and spaced apart from the imaging area of the die (step 42). The material is suitably a non-flowable material such as one having a thixotropic index of greater than 4 in its uncured state. For example, Namics 6919 is a suitable material.

A lid 44 is placed on the bead 40 (step 46) to form a glass cap 48 that defines an enclosed open-air cavity 49 around the wire bonds 38. The lid and glass cap are spaced apart from the imaging area of the die. The lid 44 and tile carrier 26 are suitably formed from a UV-transparent material. The lid 44 is suitably formed from a material that is also transparent in the visible band to facilitate inspection of the wire bonds. Other materials such as metal or ceramics may be used. The tile is exposed to UV radiation to cure the bead (step 50). Optionally, a second bead of material may be formed around the perimeter of the glass cap and cured (step 52).

Figure 3:
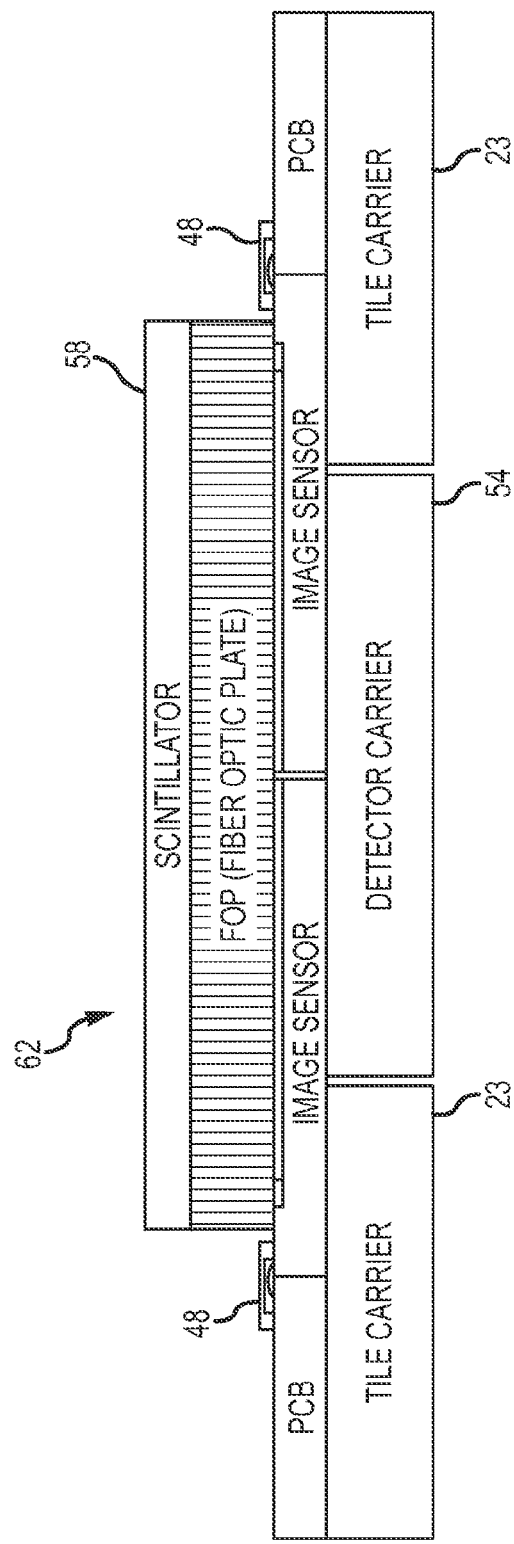
FIG. 3 is a section view of an embodiment of a detector core.
Figure 4A:
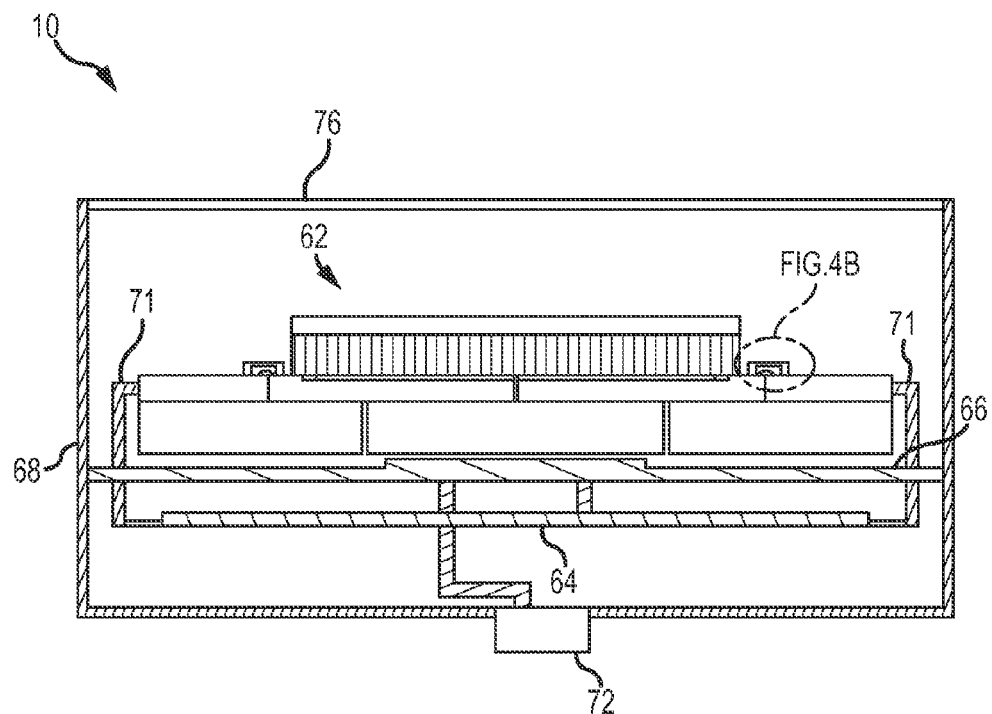
FIGS. 4a and 4b are section and FIGS. 4c and 4d are plan views of an embodiment of an X-ray imaging detector.
Figure 4B:
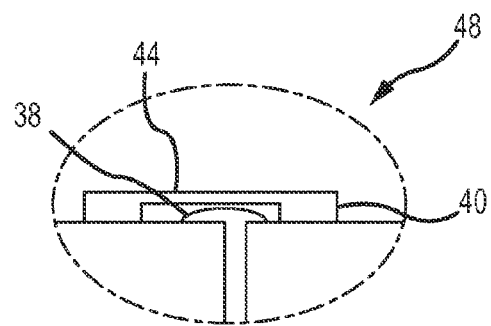
Figure 4C:
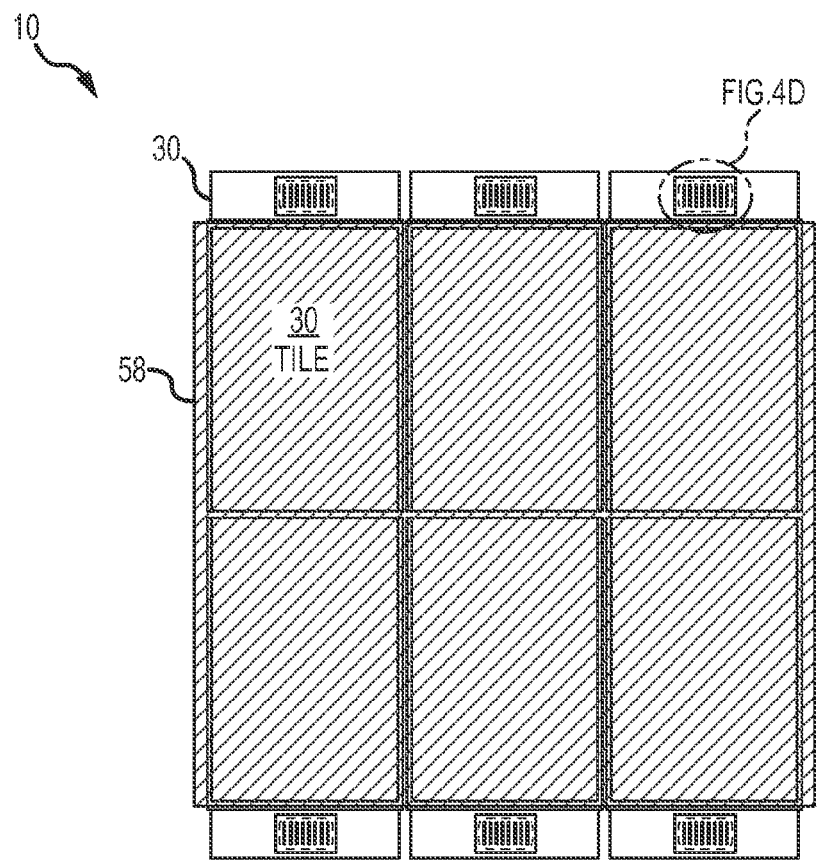
Figure 4D:
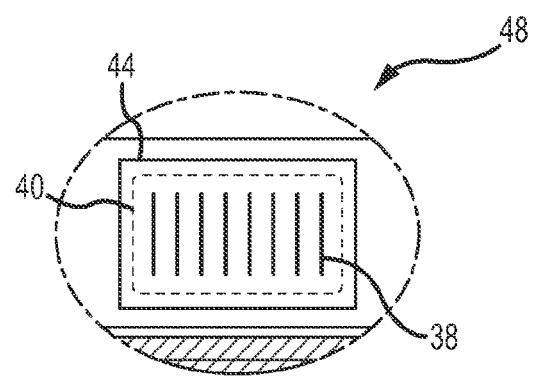

Detector-level assembly comprises attaching one or more tiles 23 to a detector carrier 54 (step 56). As shown, the exposed backsides of the imaging sensors that extend laterally from the tile carriers are mounted on the top surface of detector carrier 54 to form a multi-tile array in which the tile PCBs are arranged around the periphery of that array. A FOP/scintillator assembly 58 is attached to the imaging side of the imaging sensors (step 60). The scintillator may be a separator component or maybe deposited as a coating on the FOP. Alternate embodiments may forego the FOP and attach a scintillator directly to the multi-tile array. A carbon or aluminum plate may be formed above the scintillator. This forms a core detector 62 as shown in FIG. 3.

In this embodiment, the core detector 62 and a camera PCB 64 are suitably mounted to opposite sides of a base plate 66 (step 69). This assembly is mounted in a detector housing 68 (step 70). Alternately the core detector and camera PCB may be directly mounted to the detector housing. The camera PCB 64 is electrically connected to the one or more tile PCBs by, for example, flex connectors 71 and an external connector 72 (step 74). A lid 76 configured to allow transmission of X rays (e.g., a carbon based material) is attached to the detector housing 68 (step 76) to complete X-ray imaging detector 10. Final X ray testing is performed on detector 10 (step 78). In other embodiments, the core detector and camera PCB may be mounting using a flex or any other substrate.

Figure 5A:
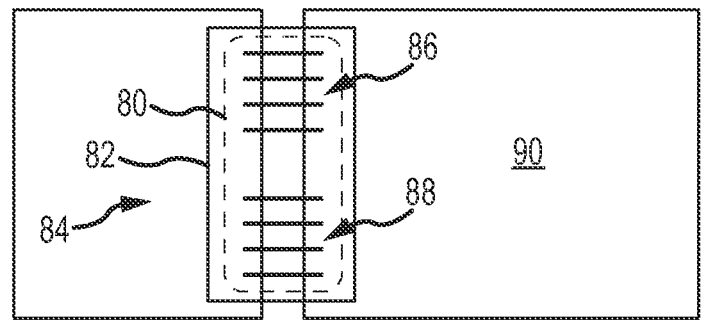
FIGS. 5a through 5c are plan views of different embodiments of the glass cap.
Figure 5B:
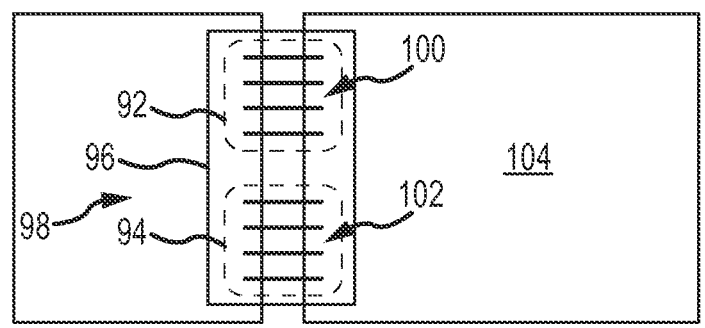
Figure 5C:
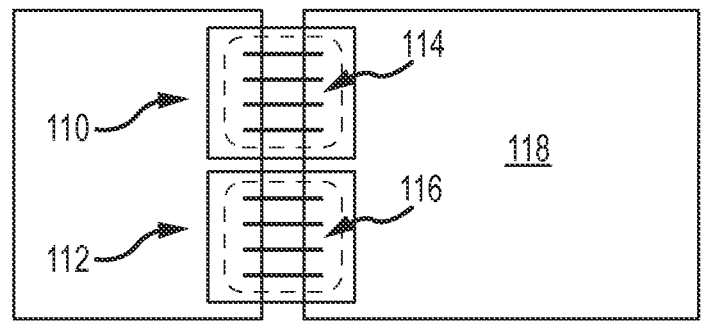

Referring now to FIGS. 5a, 5b and 5c, the glass cap may be configured in several different ways to enclose the wire bonds in an air-cavity. As shown in FIG. 5a, a single bead 80 and single lid 82 can form a single glass cap 84 around the wire bonds 86 and 88 for multiple die on an imaging sensor 90. As shown in FIG. 5b, multiple beads 92 and 94 and a single lid 96 can form a glass cap 98 around the wire bonds 100 and 102 for multiple die on an imaging sensor 104. As shown in FIG. 5c, separate glass caps 110 and 112 can be formed around the wire bonds 114 and 116 for multiple die on an imaging sensor 118.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An imaging tile for incorporation in an X or Gamma ray indirect imaging detector, said tile comprising:
    a tile carrier;
    a printed circuit board (PCB) mounted on the tile carrier, said PCB having a plurality of electrical contacts on a top surface;
    an imaging sensor including one or more CMOS or CCD dies configured to detect visible light, said one or more dies mounted on the carrier and spaced apart from said PCB to define a trench there between, each said die having non-imaging area including a plurality of electrical contacts on a top surface and an imaging area;
    a plurality of wire bonds that span the trench to connect the plurality of electrical contacts on each said die to the plurality of electrical contacts on the PCB;
    a bead of adhesive material on the top surface of the one or more die, in the trench to the surface of the carrier and on the top surface of the PCB that forms a continuous perimeter around and spaced apart from the plurality of wire bonds, said bead spaced apart from the imaging area of the die; and a lid on the bead of adhesive material that forms an enclosed open-air cavity around the wire bonds, said lid spaced apart from the imaging area of the die.

2. The imaging tile of claim 1, wherein the adhesive material is a non-flowable material having a thixotropic index greater than 4 in its uncured state.

3. The imaging tile of claim 1, wherein the trench has a depth approximately equal to the thickness of the PCB.

4. The imaging tile of claim 1, wherein the adhesive material is a UV-curable material and the tile carrier and lid are formed of UV-transparent materials.

5. The imaging tile of claim 4, wherein lid is formed of a visibly transparent material.

6. The imaging tile of claim 1, further comprising a second bead of adhesive material around the perimeter of the lid.

7. The imaging tile of claim 1, wherein a plurality of said tile are arranged with the backsides of the imaging sensors supported on a detector carrier, further comprising a conversion layer configured to convert X or Gamma rays to visible light.

8. An X or Gamma ray indirect imaging detector comprising:
a detector housing;
a detector carrier in the detector housing;
one or more tiles attached to the detector carrier, each said tile comprising a tile carrier, a printed circuit board (PCB) mounted on the tile carrier, said PCB having a plurality of electrical contacts on a top surface, an imaging sensor including one or more CMOS or CCD dies configured to detect visible light, said one or more dies mounted on the tile carrier and spaced apart from said PCB to define a trench there between, each said die having non-imaging area including a plurality of electrical contacts on a top surface and an imaging area, a plurality of wire bonds that span the trench to connect the plurality of electrical contacts on each said die to the plurality of electrical contacts on the PCB, a bead of adhesive material on the top surface of the one or more die, in the trench to the surface of the carrier and on the top surface of the PCB that forms a continuous perimeter around and spaced apart from the plurality of wire bonds, said bead spaced apart from the imaging area of the die, and a lid on the bead of adhesive material that forms an enclosed open-air cavity around the wire bonds, said lid spaced apart from the imaging area of the die;
a conversion layer positioned above the one or more tiles, said conversion layer configured to convert X-rays or gamma rays to visible light;
a detector camera PCB electrically connected to the one or more tile PCBs and mechanically connected to the detector carrier; and
a cover on the mechanical housing, said cover configured to allow transmission of X-rays or gamma rays.

9. The imaging detector of claim 8, wherein the adhesive material is a non-flowable material having a thixotropic index greater than 4 in its uncured state.

10. The imaging detector of claim 8, wherein the adhesive material is a UV-curable material and the tile carrier and lid are formed of UV-transparent materials.

11. The imaging detector of claim 8, further comprising a fiber optic plate between said one or more tiles and the conversion layer.

12. A method of packaging an imaging tile for assembly into an X or Gamma ray indirect imaging detector, comprising:
mounting a printed circuit board (PCB) and an imaging sensor including one or more CMOS or CCD dies configured to detect visible light on a tile carrier in a spaced relationship that defines a trench there between, said PCB having a plurality of electrical contacts on a top surface, each said die having a non-imaging area including a plurality of electrical contacts on a top surface and an imaging area;
forming a plurality of wire bonds that span the trench to connect the plurality of electrical contacts on the detector to the plurality of electrical contacts on the PCB;
applying a bead of non-flowable adhesive material on the top surface of the detector, in the trench to the surface of the carrier and on the top surface of the PCB that forms a continuous perimeter around and spaced apart from the plurality of wire bonds, said bead spaced apart from the imaging area of the detector;
placing a lid on the bead of adhesive material; and
curing the bead of adhesive material to form an enclosed open-air cavity around the wire bonds, said lid spaced apart from the imaging area of the die.

13. The method of claim 12, further comprising:
attaching the backside of the imaging sensors of a plurality of said tiles to a detector carrier; and
mounting a conversion layer over the front sides of the imaging sensors of the plurality of tiles, said conversion layer configured to convert X or Gamma rays to visible light to form a detector core.

14. The method of claim 13, wherein the conversion layer is formed on a fiber optic plate (FOP) that is attached to the front sides of the imaging sensors.

15. The method of claim 13, further comprising:
attaching the detector core and a camera PCB to opposing sides of a base plate;
mounting the base plate in a detector housing;
electrically connecting the camera PCB to the one or more tile PCBs and an external connector;
enclosing the assembly with a detector housing; and
attaching a cover on the detector housing, said cover configured to allow transmission of X-rays or gamma rays.

16. The method of claim 12, wherein the adhesive material has a thixotropic index greater than 4 in its uncured state.

17. The method of claim 12, wherein the adhesive material is a UV-curable material and the tile carrier and lid are formed of UV-transparent materials.

* * * * *